United States Patent [19]
Morioka et al.

[11] Patent Number: 4,835,583
[45] Date of Patent: May 30, 1989

[54] SEMICONDUCTOR DEVICE HAVING STRAINED SUPERLATTICE BUFFER LAYERS WITH IN-DOPED GAAS SUBSTRATE

[75] Inventors: Makoto Morioka, Nishitama; Tomoyoshi Mishima, Shiki; Kenji Hiruma, Koganei; Yoshifumi Katayama, Tokorozawa; Yasuhiro Shiraki, Hino, all of Japan

[73] Assignee: Hitachi, Ltd., Tokyo, Japan

[21] Appl. No.: 895,913

[22] Filed: Aug. 13, 1986

[30] Foreign Application Priority Data

Aug. 30, 1985 [JP] Japan .................. 60-189651
Mar. 5, 1986 [JP] Japan .................. 61-46113

[51] Int. Cl.$^4$ ............................. H01L 27/12
[52] U.S. Cl. ........................ 357/4; 357/16; 357/63
[58] Field of Search ............ 357/4, 52, 16, 22, 63

[56] References Cited

U.S. PATENT DOCUMENTS 4,205,329 5/1980 Dingle et al. ............ 357/16
4,697,202 9/1987 Sher ......................... 357/63

OTHER PUBLICATIONS

G. Osbourn et al., "A GaAs$_x$P$_{1-x}$/GaP Strained-Layer Superlattice", Appl. Phys. Lett., vol. 41, #2, Jul. 15, 1982, pp. 172-174.
M. Ludowise et al., "Cont. 300-K Laser Operation of Strained Superlattices", Appl. Phys. Lett., vol. 42, #6, Mar. 15, 1983, pp. 487-489.
T. Zipperian et al., "InGaAs/GaAs, Strained-Layer Superlattice (SLS) . . . ", Proc. IEDM, Dec. 1984, pp. 524-527.
T. Zipperian et al., "Strained-Quantum-Well Modulation-Doped FET", Electronics Letters, vol. 21, #18, Aug. 29, 1985, pp. 823-824.
G. Osbourn et al., "A GaAs$_x$P$_{1-x}$/GaP Strained-Layer Superlattice", Appl. Phys.

Primary Examiner—Joseph E. Clawson, Jr.
Attorney, Agent, or Firm—Antonelli, Terry & Wands

[57] ABSTRACT

An epitaxial crystal grown layer structure which permits, on an In-doped GaAs substrate, which will be industrially used in large quantities, the growth of an epitaxial layer having the same good quality as the epitaxial layer grown on an undoped GaAs substrate.

14 Claims, 3 Drawing Sheets

SEMICONDUCTOR DEVICE HAVING STRAINED SUPERLATTICE BUFFER LAYERS WITH IN-DOPED GAAS SUBSTRATE

BACKGROUND OF THE INVENTION

The present invention relates to an epitaxial grown layer structure of III-V system compound semiconductor crystals and more particularly to an epitaxial grown layer structure of the crystals provided on a GaAs substrate doped with In.

It is anticipated that the GaAs substrate doped with In will be mainly used in the future as a substrate for GaAs IC's for the following reasons. First, the In doped GaAs is excellent in its crystallinity. The defect density of the GaAs doped with e.g., 0.1 to 0.5 atomic % of In (that can also be regarded as a mixed crystal In GaAs) is smaller by two or three orders of magnitude than the ordinary GaAs. Secondly, the threshold voltage Vth of MESFETs formed in the In doped GaAs substrate does not almost vary in a wafer and among wafers. Thirdly, the In doped GaAs substrate will contribute to implement heterojunction devices on elements at low cost. High speed elements of a heterostructure made through epitaxial growth have been proposed in U.S. Pat. No. 4,424,525, for example, and particularly elements of a heterostructure formed by GaAs and $Al_xGa_{1-x}As$ will be put into practical use in the near future. However, for wider practical use of such hetero-junction elements, a hurdle of implementing them at a lower cost must be jumped over. The In doped GaAs substrate will greatly contribute to obviate this hurdle since it can be industrially used in large quantities and is excellent in its quality.

The inventors of the present invention attempted an epitaxial growth of GaAs and $Al_xGa_{1-x}As$ on the In doped GaAs substrate through MBE (Molecular Beam Epitaxy) and MOCVD (Metal Organic Chemical Vapor Deposition) techniques. As a result, so-called cross-hatched patterns were produced due to the lattice-mismatched structure. The carrier mobility was only reduced by ten percent or so compared with the case of using an In undoped GaAs substrate. The emission intensity measured through photoluminescence phenomenon in the case of the GaAs substrate doped with 17 atomic % of In was 1/10 of the case of the In-undoped GaAs substrate, which means that the crystallinity of the epitaxial layers was apparently deteriorated.

SUMMARY OF THE INVENTION

An object of the present invention is to provide, on an In doped GaAs substrate, which will be used in large quantities to manufacture the GaAs IC's, an epitaxially grown layer structure consisting of an epitaxial film(s) having the same good quality as that of the epitaxial film(s) grown on an In undoped GaAs substrate.

To attain this object of the present invention, in accordance with the present invention, on the basis of the findings of the inventors of the present invention that cross-hatched patterns are produced in the III-V system compound semiconductor epitaxial layers of e.g. GaAs and $Al_xGa_{1-x}As$ grown on the In doped GaAs substrate due to the lattice mismatching therebetween, a strained superlattice structure is used to obviate the influence of the lattice mismatching to the active layer portion of the epitaxial grown layers whose lattice constant is not identical to that of the substrate. Incidentally, use of the strained superlattice for forming, on a substrate, epitaxially grown layers whose lattice constant is not identical to that of the substrate is disclosed in the references:

(1) Applied Physics Letter, Vol. 41(2), July 15, 1982, pages 172 to 173

(2) Applied Physics Letter, Vol 42(6), Mar. 15, 1983 pages 487 to 489

One form of the strained superlattice structure in accordance with the present invention is formed by successively growing, on an In doped GaAs substrate, twenty or so layers each consisting of a GaAs film of approx. 100 Å thick doped with substantially the same amount of In as that doped in the substrate and an In-undoped GaAs film of approx. 100 Å thick. On this strained superlattice structure are epitaxially grown III-V compound semiconductor layer(s) of e.g. GaAs, $Al_xGa_{1-x}As$ or the combination of both (hetero-structure) necessary to implement a device. Thus, the III-V compound semi-conductor layer(s) can be formed on the In-doped GaAs layer through the strained superlattice structure serving as a buffer layer. In this case, the lattice constant of the area serving as an active layer of the device is equal to that of the substrate so that its property is equivalent to that of the layer grown on the In-undoped GaAs substrate.

Another form of the strained superlattice structure in accordance with the present invention is formed by successively growing, on an In-doped GaAs substrate, twenty or so layers each consisting of an AlAs film of approx. 100 Å thick having a larger lattice constant than that of the substrate and a GaAs film of approx. 100 Å thick having a smaller lattice constant than that of the substrate. On this strained superlattice structure are epitaxially grown III-V compound semiconductor layer(s) of e.g. GaAs, $Al_xGa_{1-x}As$ or the combination of both (hetero-structure) necessary to implement a device. Thus, the III-V compound semiconductor layer(s) can be formed on the In-doped GaAs layer through the strained superlattice structure serving as a buffer layer. In this case, the lattice constant of the area serving as an active layer of the device is equal to that of the substrate so that its property is equivalent to that of the layer grown on the In undoped GaAs substrate.

The above and other objects, features and advantages of the present invention will be clearly understood from the following detailed description taken in conjunction with the accompanying drawings.

DESCRIPTION OF THE PREFERRED EMBODIMENTS

Figure 1:
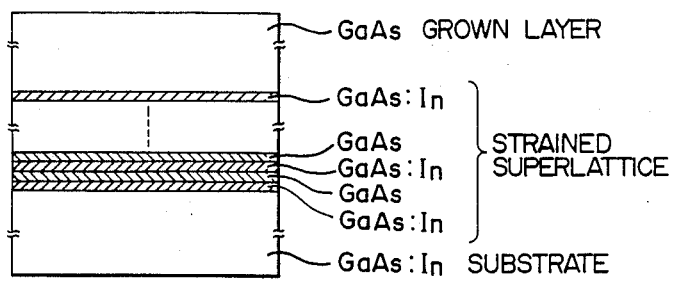
FIG. 1 shows a cross section of an epitaxial grown layer structure composed of an In-doped GaAs substrate, a strained superlattice buffer layer in one form according to the present invention and a GaAs epitaxial grown layer.

Now referring to the drawings, the present invention will be explained in detail on the basis of several embodiments thereof.

Embodiment 1

As shown in FIG. 1, a GaAs layer (3) which is 1 μm thick is epitaxially grown on a GaAs substrate (1) doped with 1 atomic % of In through a buffer layer, a strained superlattice structure which is formed by alternately growing twenty In-doped GaAs films, each of which contains the same amount of In as that in the substrate and is 100 Å thick, and twenty In-undoped GaAs films, each of which is 100 Å thick. The epitaxial growth is performed through MBE (Molecular Beam Epitaxy) for both the buffer layer and GaAs layer at a substrate temperature of 580° C.

Figure 2A:
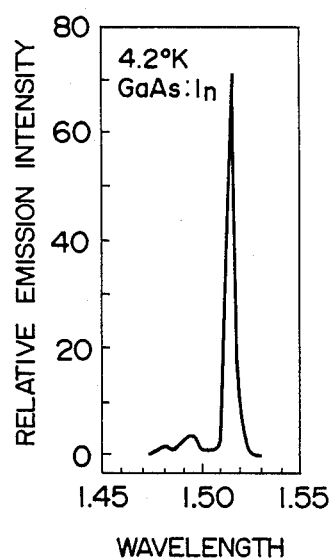
FIG. 2 is a graph showing photoluminescence (PL) spectra of the GaAs epitaxially grown layer (A) shown in FIG. 1 and of a GaAs epitaxial layer (B) grown on an In-undoped GaAs substrate.
Figure 2B:
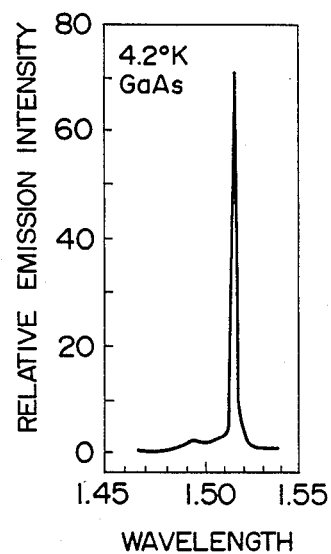

The above GaAs epitaxial layer is compared with the GaAs layer of 1.5 μm thick (including a buffer layer of 0.5 μm thick epitaxially grown on an In-undoped GaAs substrate under the same condition as the above, with respect to their properties of photoluminescence intensity and half-width and electron mobility; for measurement of the photoluminescence, the films (GaAs epitaxial layers) undoped with impurities are adopted as samples while for measurement of the electron mobility the films doped with Si of $1 - 2 \times 10^{15}$ cm$^{-3}$ are adopted. As a result of the comparison, it has been found that both GaAS epitaxial layers are substantially equal in their photoluminescence intensity and half-width, as seen from FIG. 2 showing photoluminescence spectra of the GaAs epitaxial layer (A) shown in FIG. 1 and of that (B) grown on the In-undoped GaAs substrate; the photoluminescence is excited by an Ar ion laser (the wavelength : 514.5 nm) with an excitation light amount of 10 mW, and is measured with the samples attached in the same sample holder. Further, both GaAs epitaxial layers are also substantially equal in their electron mobility as seen from the following table indicating the relations among the impurity concentration, electron mobility and resistivity of those GaAs layers doped with Si.

TABLE 1

| Substrate | Impurity Concentration n (cm$^{-3}$) | Electron Mobility μ (cm$^2$/V · sec) | Resistivity ρ (Ω · cm) |
|---|---|---|---|
| In-doped GaAs | $1.8 \times 10^{15}$ | 8250 | 0.42 |
| In-undoped GaAs | $1.4 \times 10^{15}$ | 8430 | 0.53 | each films
Accordingly, from the result of the comparison, it will be apparent that the insertion of the strained superlattice structure serving as a buffer layer enables the In-doped GaAs substrate to be effectively employed.

Figure 3:
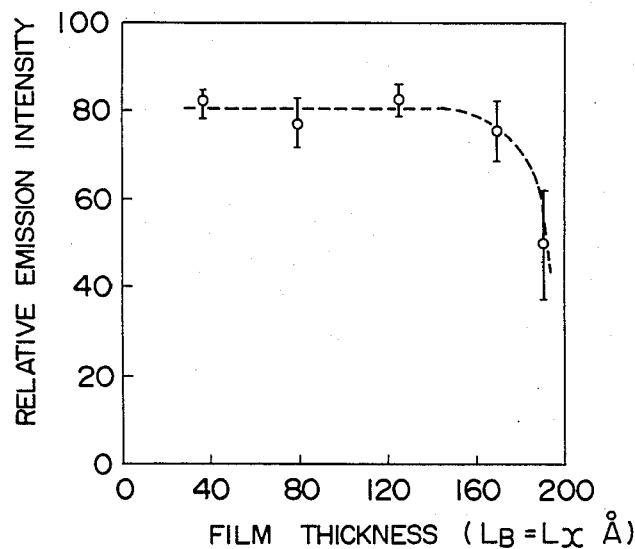
FIG. 3 is a graph showing the relation between the film thickness of each layer of the strained superlattice and the photoluminescence intensity of the GaAs epitaxially grown layer.

FIG. 3 shows the photoluminescence of the GaAs epitaxial layer when each of the films constituting the strained superlattice structure varies in its thickness with both each In-doped GaAs film and each In-undoped GaAS film having the same thickness. This graph clearly shows that the film quality of the GaAs epitaxial layer on the strained superlattice structure will abruptly deteriorate when the film thickness exceeds approx. 170 Å and the film thickness greater than 40 Å assures the stability of the film quality.

Embodiment 2

Figure 4:
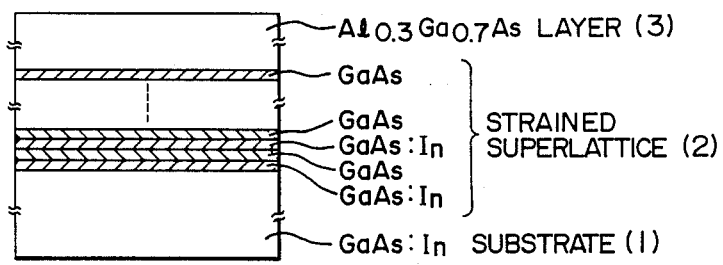
FIG. 4 shows a cross section of an $Al_xGa_{1-x}As$ epitaxial layer grown on the strained superlattice buffer layer as shown in FIG. 1.

In this embodiment, as seen from FIG. 4, a Al$_x$Ga$_{1-x}$As ($0 \leq x \leq 1$, e.g. $x \approx 0.3$ in this embodiment) layer (3) which is 1 μm thick is epitaxially grown on an In-doped GaAs substrate (1) through a buffer layer, a strained superlattice structure (2) which is formed by alternately growing, on the In-doped GaAs substrate, twenty In-doped GaAs films and twenty In-undoped GaAs films each of which is 100 Å thick. This Al$_x$Ga$_{1-x}$As layer is compared with the Al$_{0.3}$Ga$_{0.7}$As layer epitaxially grown on an In-undoped substrate through a GaAs buffer layer that is 0.5 μm thick with respect to their properties of photoluminescence and electron mobility as in Embodiment 1. As a result of the comparison it has been found that both AlGaAs layers are substantially identical in their properties. Table 2 shows relations among the value of composition X, impurity concentration, electron mobility and resistivity in both AlGaAs layers.

TABLE 2

| Substrate | x value | Impurity Concentration n (cm$^{-3}$) | Electron Mobility μ (cm$^2$/V · sec) | Resistivity ρ (Ω · cm) |
|---|---|---|---|---|
| In-doped GaAs | 0.295 | $8 \times 10^{16}$ | 1920 | 0.04 |
| In-undoped GaAs | 0.290 | $6.7 \times 10^{16}$ | 1950 | 0.05 |

Incidentally, it is well known that the Al$_x$Ga$_{1-x}$As ($0 \leq x \leq 1$) crystal indicates excellent matching of the lattice constants all over the region of x, and so can be grown as an epitaxial film having good quality all over the region of x. The Al$_x$Ga$_{1-x}$As layer having good quality all over the region of x can be offered also in the present invention using the strained superlattice structure as a buffer layer. Besides, the Al$_x$Ga$_{1-x}$As ($0 \leq x \leq 1$) in this embodiment also provides the dependency of its photoluminescence on the thickness of each of the films constituting the strained superlattice structure, which is substantially the same as that shown in FIG. 3.

Embodiment 3

Figure 5:
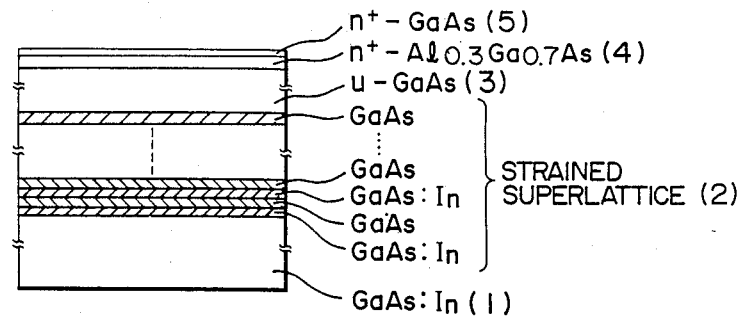
FIG. 5 shows a cross section of an HEMT structure grown on the strained superlattice structure as shown in FIG. 1.

In this embodiment, as seen from FIG. 5, an undoped GaAs layer (3), 5000 Å, an n$^+$ — Al$_{0.3}$Ga$_{0.7}$As layer (4), 400 Å and an n$^+$ — GaAs surface layer (5), 200 Å which constitute a so-called HEMT (Hgh Electron Mobility Transistor), are epitaxially grown in this order on an In-doped GaAs substrate (1) through a buffer layer of a strained superlattice structure which is formed by alternately growing, on the In doped GaAs substrate, twenty In-doped GaAs films and twenty In-undoped GaAs n$^+$ — Al$_{0.3}$Ga$_{0.7}$As layer (4), which serves to supply electrons, is doped with Si of $1- 2 \times 10^{18}$ cm$^{-3}$. A separation layer of undoped Al$_x$Ga$_{1-x}$As can be grown between the n$^+$-Al$_{0.3}$Ga$_{0.7}$As (4) and the undoped GaAS layer (3), in which two-dimensional gas flows, although the separation layer is not provided in this embodiment for simplicity of structure.

The HEMT structure wafer in this embodiment provides a sheet concentration of $6.2 \times 10$ cm$^{-2}$ and an electron mobility of 6500 cm$^2$/V.sec, which values are entirely the same as those in the HEMT structure wafer grown on an In-undoped GaAs substrate. Further, the resultant grown active layer (i.e. HEMT structure) provides the dependency of its photoluminescence on the thickness of each of the films constituting the strained superlattice structure, which is substantially the same as that shown in FIG. 3

Embodiment 4

Figure 6:
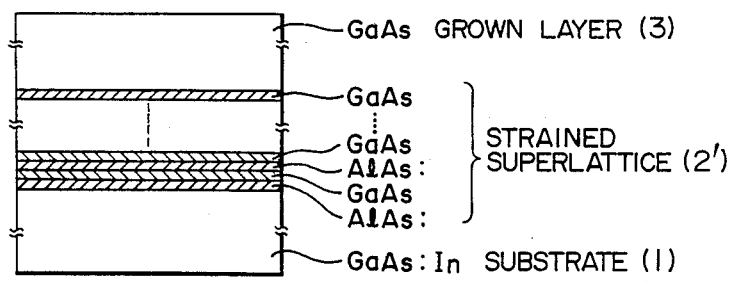
FIG. 6 is a cross section of an epitaxially grown layer structure composed of an In-doped GaAs substrate, a strained superlattice buffer layer in another form according to the present invention and a GaAs epitaxially grown layer.

In this embodiment, as seen from FIG. 6, another form of the strained superlattice structure in accordance with the present invention is adopted as a buffer layer (2), which is formed by alternately growing, on the In-doped GaAs substrate, twenty AlAs 100 Å films each having a large lattice constant than that of the substrate and twenty GaAs 100 Å films each having a smaller lattice constant than that of the substrate. A GaAs layer (3) serving as an active layer is epitaxially grown on this buffer layer. The growth is carried out through MBE for both buffer layer and the active GaAs layer at a substrate temperature of 580° C. at a growth speed of approx. 1 μm/hr.

Figure 7:
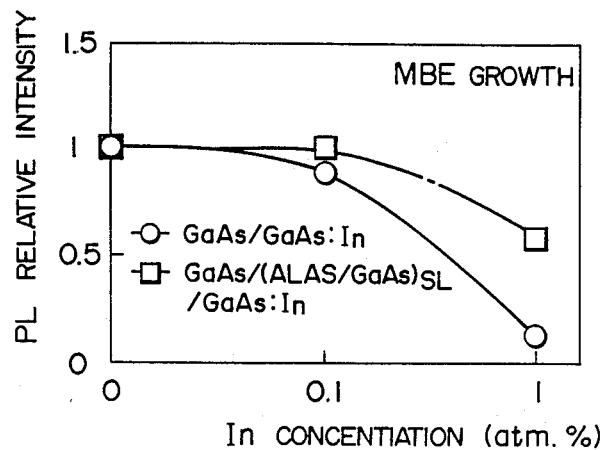
FIG. 7 is a graph showing the dependency, on the amount of In doped in the substrate, of the Pl intensity of the GaAs layer of FIG. 6 normalized with that of the GaAs layer grown on an In-undoped GaAs substrate.

The GaAs layer thus epitaxially grown on the In-doped GaAS substrate through the strained superlattice structure as shown in FIG. 6 has a greatly improved photoluminescence property because of the existence of the strained superlattice structure. FIG. 7 shows photoluminescence of the GaAs epitaxial grown layer at 4.2° K., measured through the use of a light source of Ar laser at a wavelength of 5145 Å; the ordinate represents relative intensity when assuming that the photoluminescence intensity of the GaAs layer epitaxially grown on the In undoped gaAs substrate is 1, and the abscissa represents the amount of In doped in the substrate; circle marks represent the values when the GaAs layer (2 μm) is directly grown on the In doped GaAs substrate while square marks represent the values when the GaAs layer (2 μm) is grown on the In doped layer through the strained superlattice structure as shown in FIG. 6. As seen from the figure, with respect to the GaAs layer grown on the GaAs substrate doped with 1 atomic % of In, its photoluminescence intensity when it is grown on the In-doped GaAs substrate through the above strained superlattice structure is much higher than that when it is directly grown thereon. Namely, the former is as high as 60% of the photoluminescence intensity of the GaAs layer grown on In undoped GaAs substrate, while the latter is only approx. 10% thereof. Besides, with respect to the GaAs layer grown on GaAs substrate doped with 0.1 atomic % of In, its photoluminescence intensity is substantially equal to that of the GaAs layer grown on the In-undoped substrate. From the above experimental facts, it will be understood that the strained superlattice structure as shown in FIG. 6 greatly influences the property of the GaAs epitaxially grown layer.

Incidentally, although only the GaAs epitaxially grown layer has been explained in this embodiment, it will be apparent to those skilled in the art that an Al$_x$Ga$_{1-x}$As epitaxially grown layer and a GaAs/Al$_x$Ga$_{1-x}$As heteroepitaxially grown layer are also greatly influenced.

As described in detail in several embodiments of the present invention, the property of the epitaxial layer grown on an In-doped GaAs substrate, which will be industrially used in large quantities in the future as a substrate for the crystal growth through e.g. MBE and MOCVD and a GaAS IC substrate, can be considerably improved by means of a strained superlattice structure having a simple system of GaAs:In/GaAs or AlAs/GaAs. Thus, the In doped GaAs substrate can be used as an epitaxial growth substrate by means of a simple technique. This means that the crystal materials i.e. In-doped GaAs which can be used in the largest quantities, and are most cheap, can be used as epitaxial growth substrate and so the devices having the GaAs layer provided on the substrate as an active layer can be offered at lower cost. The present invention is epoch-making in the history of the crystal growth substrate, and provides very significant industrial and economical effects or merits.

We claim:

1. A semiconductor device comprising an In-doped GaAs substrate, a buffer layer of a strained superlattice grown on said substrate, and a III-V compound semiconductor layer grown on said buffer layer, said III-V compound semiconductor layer forming an active region of the device and having a lattice constant that is not identical to that of the substrate, said strained superlattice being a laminar structure composed of alternating In-doped GaAs films and III-V compound semiconductor films, wherein the influence of lattice mismatch between said substrate and the active region is reduced.

2. A semiconductor device comprising an In-doped GaAs substrate, a buffer layer of a strained superlattice grown on said substrate, and a III-V compound semiconductor layer grown on said buffer layer, said III-V compound semiconductor layer forming an active region of the device and having a lattice constant that is not identical to that of said substrate, said strained superlattice being a laminar structure composed of alternating (a) III-V compound semiconductor films each having a larger lattice constant than that of said substrate and (b) III-V compound semiconductor films each having a smaller lattice constant than that of the substrate, wherein the influence of lattice mismatch between said substrate and the active region is reduced.

3. A semiconductor device according to claim 1, further comprising means for allowing a current to flow through said active region.

4. A semiconductor device according to claim 1, wherein each of the films of the strained superlattice has a thickness in the range of 40Å–170Å.

5. A semiconductor device according to claim 1, wherein said III-V compound semiconductor layer is a layer selected from the group consisting of a GaAs epitaxially grown layer, an Al$_x$Ga$_{1-x}$As epitaxially grown layer, and a GaAs/Al$_x$Ga$_{1-x}$As heteroepitaxially grown layer.

6. A semiconductor device according to claim 1, wherein said active region comprises an n$^+$-type electron supplying layer and a channel layer of electron affinity different than that of said electron supplying layer.

7. A semiconductor device according to claim 6, wherein said electron supplying layer is formed of n$^+$-Al$_x$Ga$_{1-x}$As and said channel layer is formed of GaAs.

8. A semiconductor device according to claim 7, further comprising an n$^+$-GaAs surface layer on the n$^+$-Al$_x$Ga$_{1-x}$As electron supplying layer.

9. A semiconductor device according to claim 2, further comprising means for allowing a current to flow through said active region.

10. A semiconductor device according to claim 2, wherein each of the films of the strained superlattice has a thickness in the range of 40Å–170Å.

11. A semiconductor device according to claim 2, wherein said III-V compound semiconductor layer is a layer selected from the group consisting of a GaAs epitaxially grown layer, an $Al_xGa_{1-x}As$ epitaxially grown layer, and a $GaAs/Al_xGa_{1-x}As$ heteroepitaxially grown layer.

12. A semiconductor device according to claim 2, wherein said active region comprises an $n^+$-type electron supplying layer and a channel layer of electron affinity different than that of said electron supplying layer.

13. A semiconductor device according to claim 12, wherein said electron supplying layer is formed of $n^+$-$Al_xGa_{1-x}As$ and said channel layer is formed of GaAs.

14. A semiconductor device according to claim 13, further comprising an $n^+$-GaAs surface layer on the $n^+$-$Al_xGa_{1-x}As$ electron supplying layer.

* * * * *